United States Patent
Hasegawa et al.

[11] Patent Number: 6,040,909
[45] Date of Patent: Mar. 21, 2000

[54] SURFACE POSITION DETECTING SYSTEM AND DEVICE MANUFACTURING METHOD USING THE SAME

[75] Inventors: Masanobu Hasegawa, Utsunomiya; Minoru Yoshii, Tokyo; Yoshinori Ohsaki, Utsunomiya, all of Japan

[73] Assignee: Canon Kabushiki Kaisha, Tokyo, Japan

[21] Appl. No.: 09/070,741

[22] Filed: May 1, 1998

[30] Foreign Application Priority Data

May 2, 1997 [JP] Japan ................... 9-130484
Apr. 25, 1998 [JP] Japan ................... 10-131132

[51] Int. Cl.⁷ .................................................. G01B 11/14
[52] U.S. Cl. .................. 356/375; 250/548; 250/559.3; 356/401
[58] Field of Search ........................ 356/399–401, 356/375, 376; 250/548, 559.3, 559.2; 355/53

[56] References Cited

U.S. PATENT DOCUMENTS

| | | |
|---|---|---|
| 5,200,800 | 4/1993 | Suda et al. . |
| 5,291,023 | 3/1994 | Hasegawa et al. . |
| 5,313,272 | 5/1994 | Nose et al. . |
| 5,333,050 | 7/1994 | Nose et al. . |
| 5,369,486 | 11/1994 | Matsumoto et al. . |
| 5,396,335 | 3/1995 | Hasegawa et al. . |
| 5,414,515 | 5/1995 | Kawashima . |
| 5,432,603 | 7/1995 | Sentoku et al. . |
| 5,461,474 | 10/1995 | Yoshii et al. . |
| 5,486,919 | 1/1996 | Tsuji et al. . |
| 5,495,336 | 2/1996 | Nose et al. . |
| 5,583,688 | 12/1996 | Hornbeck . |
| 5,602,399 | 2/1997 | Mizutani . |
| 5,610,715 | 3/1997 | Yoshii et al. . |
| 5,610,718 | 3/1997 | Sentoku et al. . |
| 5,652,657 | 7/1997 | Yoshii et al. . |
| 5,717,492 | 2/1998 | Sentoku et al. . |
| 5,726,758 | 3/1998 | Hasegawa et al. . |
| 5,750,294 | 5/1998 | Hasegawa et al. . |
| 5,751,426 | 5/1998 | Nose et al. . |
| 5,767,962 | 6/1998 | Suzuki et al. . |
| 5,777,744 | 7/1998 | Yoshii et al. . |

Primary Examiner—K. P. Hantis
Attorney, Agent, or Firm—Fitzpatrick, Cella, Harper & Scinto

[57] ABSTRACT

A detecting system for detecting positional information related to a surface of an object. The detecting system includes a variable pattern generator for projecting an arbitrary pattern image on the surface of the object, a light projecting optical system for projecting a pattern, defined by the variable pattern generator, to the surface of the object along an oblique direction, a light receiving optical system for directing light from an image of the pattern and a light receiving element for detecting the light directed by the light receiving optical system. Surface position information about the surface of the object is detected on the basis of the detection by the light receiving element.

42 Claims, 13 Drawing Sheets

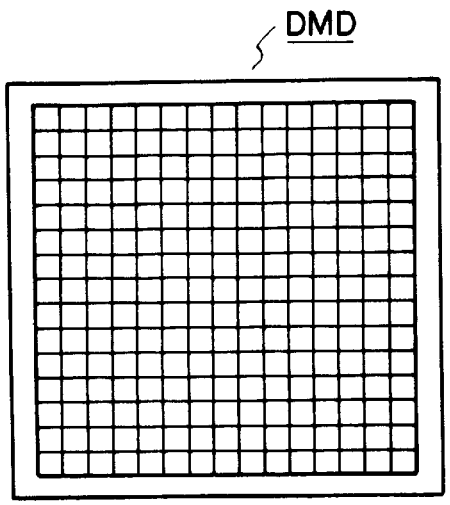
FIG. 2B-A
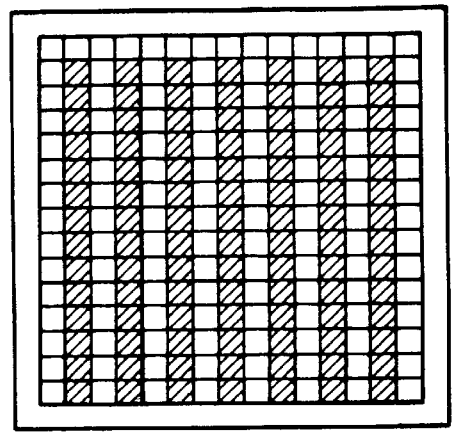
FIG. 2B-B
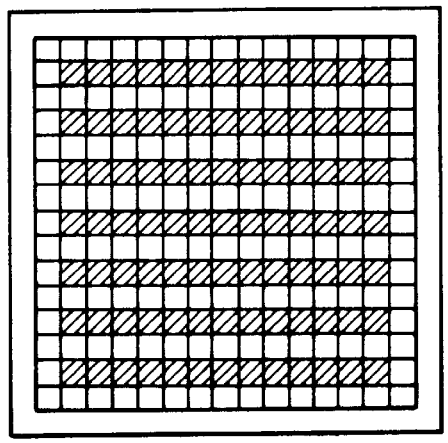
FIG. 2B-C
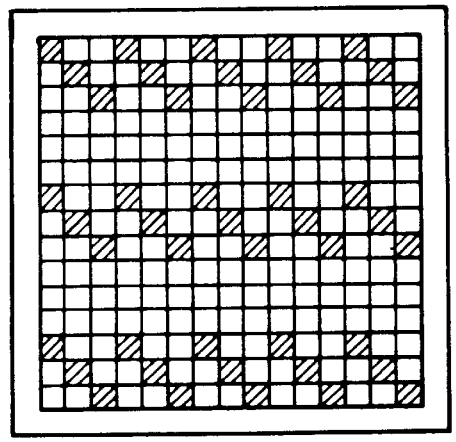
FIG. 2B-D

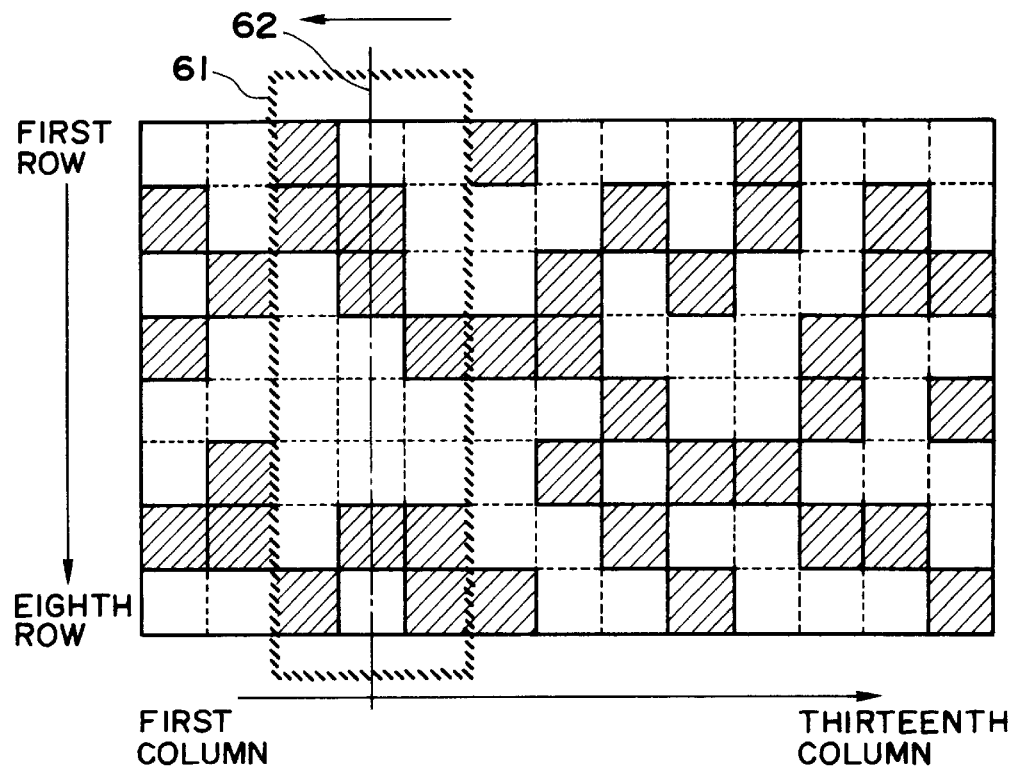
FIG. 4
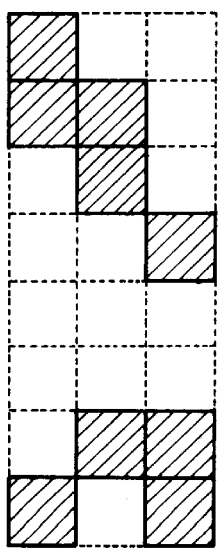   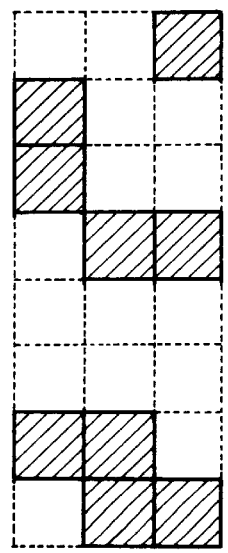
FIG. 5A       FIG. 5B

SURFACE POSITION DETECTING SYSTEM AND DEVICE MANUFACTURING METHOD USING THE SAME

FIELD OF THE INVENTION AND RELATED ART

This invention relates to a surface position detecting system and a device manufacturing method using the same. For example, the present invention is suitably applicable in a lithographic process using a projection exposure apparatus or a scanning exposure apparatus, during the procedure for the manufacture of semiconductor devices such as ICs or LSIs, image pickup devices such as CCDs, display devices such as liquid crystal panels, or other devices such as magnetic heads, for measuring the level (height) or tilt of the surface of a wafer and for adjusting (focusing) the position thereof with respect to an optical axis when a pattern of a first object such as a reticle is to be projected onto the surface of the wafer (second object) through a projection optical system.

Various reduction projection exposure apparatuses (steppers) or scan type projection exposure apparatuses, wherein an image of a circuit pattern of a mask or reticle is formed on a photosensitive substrate through a projection optical system (projection lens) and the photosensitive substrate is exposed thereby in a step-and-repeat method or step-and-scan method, have recently been proposed as a fine processing technique for the manufacture of semiconductor devices such as ICs or LSIs.

In steppers, a circuit pattern formed on a reticle is transferred, in a reduced scale, to a predetermined position on the surface of a wafer through a projection optical system having a predetermined reduction magnification. After completion of a single projection and transfer operation, a stage on which the wafer is placed is moved by a predetermined amount, and the transfer process is repeated. This procedure is repeated so that the whole wafer surface is exposed.

In scan type projection exposure apparatuses, light from light source means is transformed by illumination means into slit-like light to illuminate a pattern formed on the surface of a first object (reticle). The illuminated pattern of the first object is projected and printed on the surface of a second object (wafer) placed on a movable stage through a projection optical system, while the first object and the movable stage are scanningly moved by scanning means in synchronism with each other, in a widthwise direction of the slit-like light and at a speed ratio corresponding to the projection magnification of the projection optical system.

For transfer of a fine circuit pattern by use of such projection exposure apparatuses, it is important to suitably set the focus position (position with respect to an optical axis of a projection optical system) of the wafer surface.

FIG. 1 is a schematic view of a main portion of a conventional projection exposure apparatus having a surface position detecting system for detecting surface position information (optical axis direction information) of the surface of a wafer. Denoted in the drawing at 21 is a reticle which is an original of a circuit pattern (i.e., first object). It is placed on a reticle stage 22. Denoted at 23 is a projection lens for projecting the reticle at a reduction ratio 1/5. Denoted at 6 is a wafer having a resist coating, and denoted at 7 is a wafer chuck for holding the wafer 6 by attraction. Denoted at 8 and 9 is an X-Y stage, and denoted at 10 is a Z stage.

Denoted at 101 is an illumination system for illuminating the reticle 21. When the reticle 21 is illuminated with light 20 from the illumination system 101, the circuit pattern of the reticle 21 is imaged upon the wafer 6, whereby the circuit pattern is printed on the resist. Upon completion of printing for one shot, the X-Y stage 8 and 9 is moved stepwise for printing of an adjacent shot. In this manner, circuit patterns are printed in a matrix on the whole surface of a single wafer.

Next, the surface position detecting system will be described. The light projected by the light source 1 is transformed by the collimator lens 2 into parallel light which then illuminates the whole surface of a slit 17 uniformly, from the bottom side thereof. The slit 17 and the surface 6a of the wafer 6 to be detected are placed in a Scheinmpflug's relation with each other, so that an image of the slit defined as opening on the slit 17 is projected on the wafer 6 surface.

The slit image thus projected on the wafer 6 surface is re-imaged on the surface of a slit 18 through a light receiving lens system 11, a movable mirror 12 and a light receiving lens system 13. The light passing the aperture of the slit 18 is collected by a condenser lens 15, and it is directed to a light receiving sensor 16.

At the light receiving side, the wafer 6 surface and the slit 18 are placed in an optically conjugate relation with each other, and there are openings disposed in group at positions corresponding to the openings of the light projecting side slit 17, respectively. The oscillation mirror 12 moves by simple harmonic motion a spatial image of the slit image of the slit 17 relative to the light receiving side slit 18. As a result of this, the light receiving sensor 16 detects an AND output of the spatial image of the light projecting side slit 17 and the slit of the light receiving side slit 18.

When the wafer 6 shifts upwardly/downwardly (along the optical axis AX direction) as viewed in the drawing, the pattern image displaces on the slit 18. Thus, in response to oscillation of the oscillating mirror 12, the signal obtainable at the light receiving sensor 18 changes with time. On the basis of such an output signal of the light receiving sensor 16, the reference surface position of the wafer is calculated in a signal processing circuit 24. In accordance with the result of calculation, a driver 25 moves a Z stage 10 to adjust the height (level) of the wafer 6 surface.

An optical type surface position detecting system such as illustrated in FIG. 1 enables high precision measurement of the surface position when the surface 6a to be inspected comprises an idealistic reflection surface such as a mirror surface. However, as is known, if there is a step on the surface to be measured such as a processed wafer, for example, or the surface to be inspected is covered by a transparent film such as a resist, there occurs an error in the position detection.

If, for example, a wafer sample having a local surface step of about 1 micron is coated with a resist of about 1 micron, depending on the light incidence condition, there may occur an error of about 1 micron in the surface position detection. Such a detection error may be finally processed as an offset, since a best focus position can be determined through trial printings under various focus conditions before actual wafer printing. However, a large offset will be a factor for deteriorating measurement reproducibility.

What is aimed fundamentally in the detection of the wafer surface position is to register the wafer exposure image plane and the reticle projected image plane defined by a projection lens. However, generally, a projected image of a reticle is not flat due to:

(1) Distortion of a reticle itself; and (2) Curvature of image of a projection lens.

Also, the wafer surface which is the surface to be exposed has distortion, independently of the reticle image plane. It is, therefore, difficult to completely register the reticle image plane and the surface to be exposed. Currently, this is a very serious problem since recent projection lenses have an enlarged numerical aperture (N.A.) and a sufficient depth of focus cannot be provided.

Particularly, recent semiconductor devices are very fine and, due to an enlarged numerical aperture of projection lenses, the depth of focus which means a tolerable range from a best image plane for pattern printing becomes smaller and smaller. Thus, more strict detection precision is required for the wafer surface position detection.

SUMMARY OF THE INVENTION

It is an object of the present invention to provide a surface position detecting system by which positional information about a wafer surface with respect to an optical axis direction as well as tilt information about the wafer surface can be detected precisely, such that the wafer surface can be positioned at an imaging position of a projection optical system very precisely and that large integration devices can be produced.

It is another object of the present invention to provide a device manufacturing method which is based on such a position detecting system described above.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2B-A, 2B-B, 2B-C and 2B-D are schematic views, respectively, for explaining DMD picture element mirrors usable in the present invention.

FIG. 4 is a schematic view for explaining a DMD picture element mirror and a scanning slit, in a scan type projection exposure apparatus.

FIGS. 5A and 5B are schematic views, respectively, for explaining a change, with respect to time, of a DMD picture element mirror in a scan type projection exposure apparatus.

DESCRIPTION OF THE PREFERRED EMBODIMENTS

Figure 1:
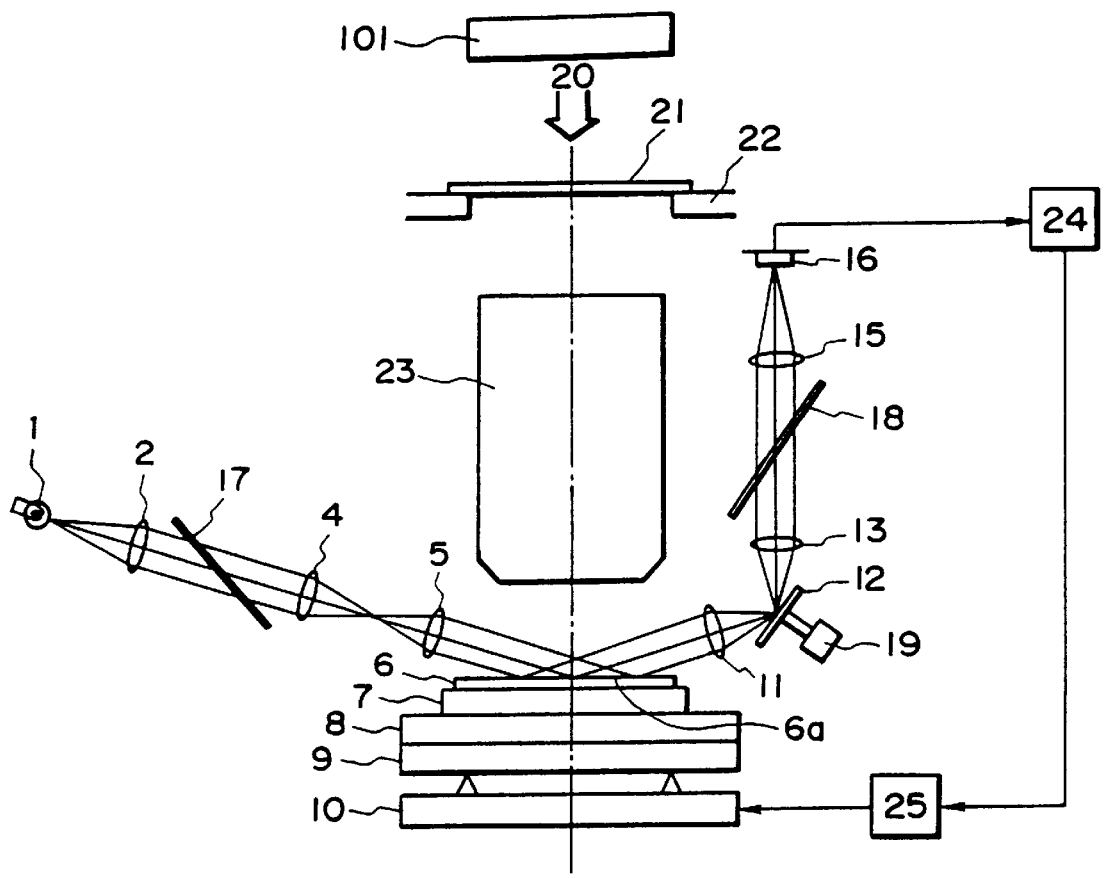
FIG. 1 is a schematic view of a main portion of a conventional projection exposure apparatus.
Figure 2A:
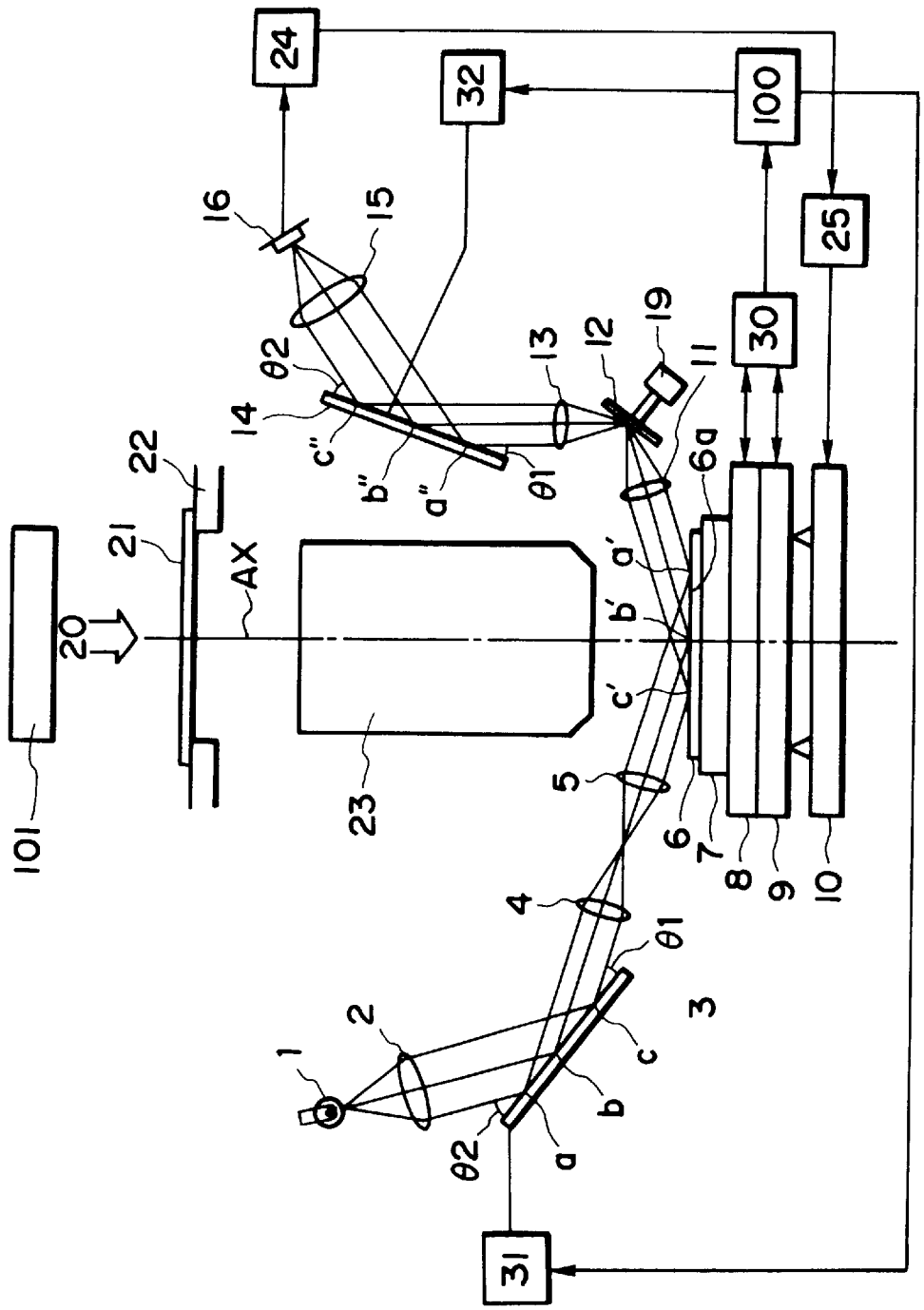
FIG. 2A is a schematic view of a main portion of a projection exposure apparatus according to a first embodiment of the present invention.

FIG. 2A is a schematic view of a main portion of a projection exposure apparatus according to a first embodiment of the present invention, which includes a position detecting system according to the present invention. Before explaining the FIG. 2A embodiment, a DMD element used in this embodiment will be described first.

The DMD element refers to a deformable mirror device element which comprises two-dimensionally arrayed small mirrors formed on a silicon chip with photolithography. Each mirror is called a picture element mirror or pixel mirror which can be actuated by a small angle (up to 10 deg.) by electrostatic power. The picture element mirror has a minimum size of about 17 microns square, and the opening rate is over 80%. A plurality of such small mirrors is combined to define reflection type slit groups.

FIG. 2B-A is a schematic view of a DMD element. The matrix of picture element mirrors includes a maximum number of 568×768 or more. FIGS. 2B-B, 2B-C and 2B-D show examples of desired slit patterns which can be defined by actuating picture element mirrors. While three simple patterns are illustrated in these drawings, basically any pattern can be defined. As regards the size of such a DMD element, since it is produced basically with a photolithographic process, the same size as that of an exposure shot can be accomplished.

For example, when a unit magnification afocal system is used as a projection lens system for projecting a DMD element to the exposure shot surface, the DMD element can be used as a slit which enables measurement of the whole exposure shot surface.

Now, the components of the first embodiment shown in FIG. 2A will be described. In this embodiment, a wafer 6 for device manufacture is used as an object, and surface position information (focus position information) about the wafer surface, in relation to the height (level) thereof with respect to a vertical direction (Z direction) as well as any tilt thereof, is detected.

Denoted in the drawing at 101 is an illumination system for projecting exposure light, and it emits exposure light 20 which may comprise light of i-line in the deep ultraviolet region or light of a KrF or an ArF excimer laser. Denoted at 21 is a reticle (first object) having a circuit pattern formed thereon. It is placed on a reticle stage 22.

Denoted at 23 is a projection lens (projection optical system) for projecting, in a reduced scale, the circuit pattern of the reticle 21 onto a wafer (second object) 6 which is coated with a resist. The wafer 6 is held by a wafer chuck 7 by attraction.

In a case wherein the embodiment is applied to a step-and-scan type projection exposure apparatus, the projection exposure is performed while scanningly moving (scanning) the reticle 21 and the wafer 6 in synchronism with each other, at a predetermined speed ratio corresponding to the imaging magnification of the projection optical system 23. Denoted at 8 and 9 is an X-Y stage, and denoted at 10 is a Z tilt stage.

In this embodiment, a surface position detecting system comprises elements denoted at 1–5, 11–16 and 19, and it is used to detect the surface position information about the wafer 6. Based on this, the height (level) of the wafer 6 with respect to an optical axis direction of the projection optical system 23 is brought into an optically conjugate relation with the reticle 21 with respect to the projection optical system 23. Namely, the Z tilt stage 10 is actuated by a driver 25 so that the wafer 6 is placed on the best imaging plane of the projection optical system 23.

Particularly, in this embodiment, DMD elements are disposed in the light path of the surface position detecting system as light projecting and receiving slits (pattern generator means), such that, by actuating desired picture element mirrors of the DMD element, a desired pattern can be formed (a variable slit is provided). An image of such a pattern is projected on the region of the wafer to be inspected, and measurement to a desired portion of that region is enabled. Information related to measurement points may be stored into a computer for actuation of a DMD element beforehand so that mirror elements corresponding to the measurement points may be controlled to provide the light to be projected to the surface to be inspected. This enables high precision focus detection with less measurement error. Further, in this embodiment, selective focusing can be made in relation to such an area within the exposure shot that includes a narrowest linewidth, on the basis of pattern projection and surface position detection. This enables improvement of printing precision for a critical layer and improvement of total chip yield.

Next, components of the surface position detecting system of this embodiment will be explained. The illumination light (measurement light) having a wavelength $\lambda$, emitted from the light source 1 such as a light emitting diode (LED) or a halogen lamp, is transformed by a collimator lens 2 into parallel light which is then projected on a light projecting side DMD element (first DMD element) 3. Light reflected by picture element mirrors (pattern) of the DMD element is imaged on the wafer 6 surface by light projecting lenses 4 and 5. Here, on the wafer 6 surface, there is formed a pattern image which is based on the picture element mirrors of the DMD element 3. The DMD element 3 and the wafer 6 are placed in a Scheinmpflug's condition with each other with respect to the light projecting lenses 4 and 5.

The illumination light reflected by the wafer 6 is collected by means of a light projecting lens 11, an oscillating mirror 12 and a light receiving lens 13, such that it is re-imaged on the picture element mirror surface of a light light receiving side DMD element (second DMD element) 14. The light from the DMD element 14 is collected on the surface of a light receiving sensor 16 by a lens system 15.

The light projecting side DMD element 3 and the light receiving side DMD element 14 are placed in an optically conjugate relation with each other. The oscillation mirror 12 is oscillated by driving means 19 to oscillate the pattern image, formed on the wafer 6 surface, upon the surface of the light receiving side DMD element 14. Thus, the light receiving sensor 16 detects an AND output of the pattern image formed on the wafer 6 surface and the pattern based on the picture element mirrors of the light receiving side DMD element 14.

In this embodiment, when the wafer 6 shifts upwardly/downwardly (along the optical axis AX direction of the projection optical system), the pattern image formed on the light receiving side DMD element displaces along the DMD element 14 surface. Here, the movement of the pattern image is detected by the light receiving sensor 16 as a change in light quantity. Then, an output signal from the light receiving sensor 16 is calculated by a signal processing circuit 24, whereby surface position information (focus position information) such as height information and/or tilt information about the wafer 6 is detected. On the basis of the result of the detection, the driver 25 actuates the Z tilt stage 10, whereby the wafer 6 surface is brought into registration with the best imaging plane of the projection optical system 23.

Now, features of the components in this embodiment will be described. The light projecting side DMD element 3 is set with an angle $\theta_2$ with respect to the optical axis of the illumination light, and with an angle $\theta_1$ with respect to the optical axis of the light projecting optical systems 4 and 5. The angle $\theta_1$ is determined in accordance with the magnification of the light projecting optical systems 4 and 5 and the angle of incidence of focus detecting light upon the wafer 6. If the magnification is 1 (unit) and the incidence angle is 15 deg., the angle $\theta_1$ is equal to 15 deg. The angle $\theta_2$ is determined in accordance with the angle $\theta_1$ and the deflection angle $\phi$ of the picture element mirror, and a largest angle within a range not greater than $\theta_1+2\phi$ should desirably be selected. If $\phi$–10 deg., $\theta_2$ is equal to 35 deg.

The picture element mirrors of the DMD element 3 have a deflection angle 0 deg. when the drive voltage is zero, so that they are parallel to the surface of the DMD element 3. Thus, light impinging on a picture element mirror with the drive voltage held off is regularly reflected thereby with an angle 35 deg. with respect to the DMD element 3, such that the light does not enter the light projecting lens 4 or 5.

If on the other hand light impinges on a picture element mirror with the drive voltage held on (i.e., being applied), it is deflected by this mirror by 20 deg., such that the emission angle from the surface of the DMD element 3 is 15 deg. Thus, the mirror functions as one component for forming a slit image, as a secondary light source. The positional relation between the DMD element 3 and the surface 6a to be measured satisfies the Scheinmpflug's condition, and in the drawing the picture element mirrors a, b and c and the measurement points (spatial images) a', b' and c' are in an optically conjugate relation with each other. The spatial images a', b' and c' of the picture element mirrors a, b and c as projected on the measurement points a', b' and c' are reflected by the wafer 6 surface and, by means of the light receiving lens systems 11 and 13, they are re-imaged upon the light receiving side DMD element 14. The picture element mirrors a", b" and c" of the light receiving side DMD element 14 are disposed at positions optically conjugate with the measurement points a', b' and c', and the picture element mirrors a, b and c of the light projecting side DMD element 3 and the picture element mirrors a", b" and c" of the light receiving side DMD element 14 are in an optically conjugate relation with each other. As a matter of course, the patterns defined by these picture element mirrors of the DMD elements 3 and 14 have the same shape or an analogous shape corresponding to the imaging magnification.

When the oscillation mirror 12 is at a predetermined angle and if the spatial images a', b' and c' of the DMD element 3 and the surface 6' to be measured are registered with each other, the reflection light by the spatial images a', b' and c' of the picture element mirrors a, b and c is reflected by the picture element mirrors a", b" and c". Thus, the largest quantity of light impinges on the light receiving sensor 16. Here, if the frequency of the oscillation mirror 12 is f, the frequency of an output signal from the light receiving sensor 16 is 2ƒ. Also, if the wafer 6 displaces from this reference position, the component of frequency 2ƒ in the output signal decreases while the component of frequency ƒ increases. Therefore, by detecting the phase of this output signal with the signal processing circuit 24, the surface position information about the surface 6a to be measured can be calculated.

Next, referring to FIGS. 3A, 3B and 4, the operation in a case wherein the surface position detecting system is applied to a projection exposure apparatus for the manufacture of semiconductor devices, will be described.

Figure 3A:
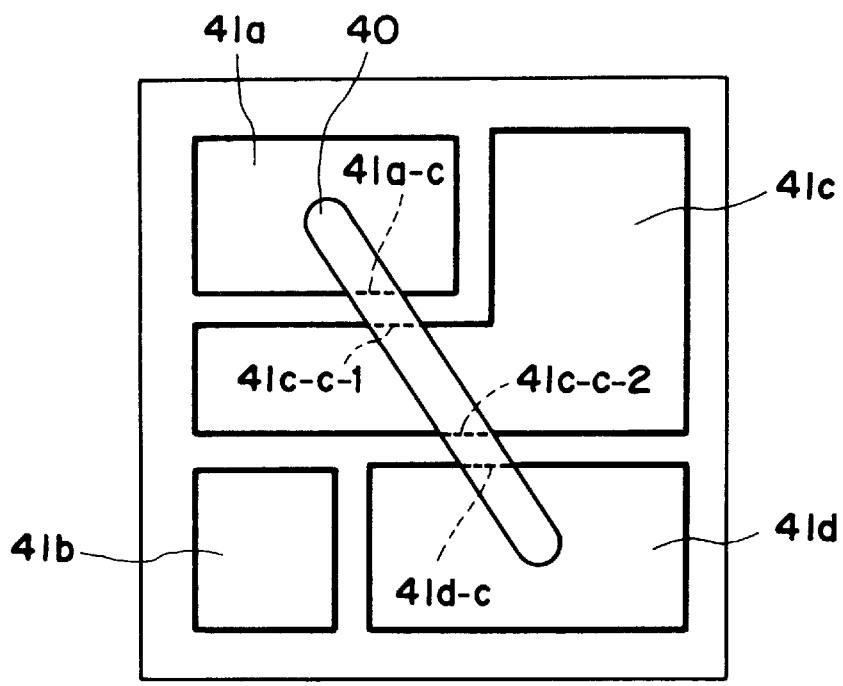
FIGS. 3A and 3B are schematic views, respectively, for explaining the positional relation between an IC pattern and a slit.

FIG. 3A shows a case wherein a measuring light spot provided by a conventional surface position detecting system is incident on pattern regions on a wafer. Denoted in the drawing at 41a–41d are pattern regions, and their configurations define a step. Denoted at 40 is a measuring light spot. Usually, a slit-like light is used for this measuring spot 40, and in many cases it is projected with a certain angle with respect to an edge of a pattern. The reason therefor is that, if the measuring spot impinges on an edge, there occurs scattering by the edge which adversely affects a measured value.

Namely, if the slit is projected parallel to the edge, the effect becomes largest. Since the region where the slit intersects the edge can be narrowed by projecting the slit obliquely with respect to the edge, the detection error can be reduced to some extent. However, it is not possible to decrease it to zero. Since projection lenses recently used have a large numerical aperture (N.A.) on an order of 0.5–0.6, the depth of focus at the image plane is not greater than 1 micron. Thus, even a small detection error cannot be disregarded.

Figure 3B:
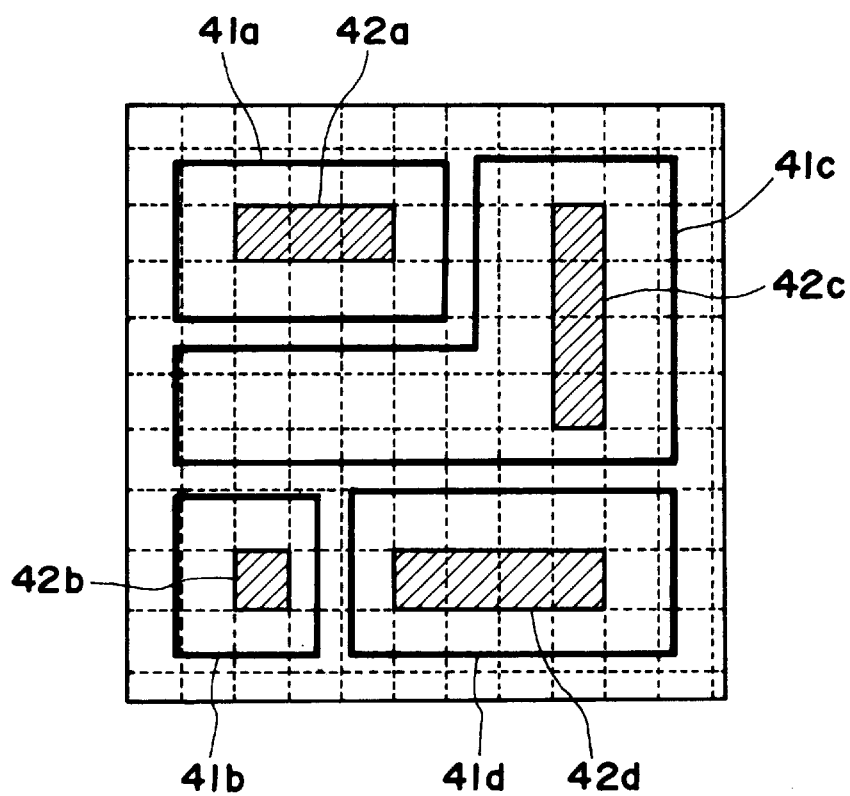

FIG. 3B shows an example wherein a surface position detecting system according to the present invention is applied to the same pattern region. Since the light entrance side DMD element 3 is optically conjugate with the pattern surface, with respect to the patterns 41a–41d, the imaging positions of picture element mirrors correspond to the matrix depicted by broken lines.

In accordance with the present invention, the slit image to be defined by a projected pattern image provided by these picture element mirrors can be produced as desired by means of a DMD driver 31. Thus, for example, light is projected to regions 42a–42d. Since in these regions 42a–42d thus irradiated, the focus beam does not impinge on the edge, any focus error due to edge scattering can be reduced to zero. In this manner, the present embodiment enables high precision surface position detection.

FIG. 4 shows a pattern as projected on a wafer surface in a case wherein the present invention is applied to a scan type projection exposure apparatus. Rectangular regions of a broken-line matrix, being depicted by hatching, correspond to measurement regions on a wafer 6 surface as divided in terms of the size of each picture element mirror of the DMD element 3. Denoted at 61 is a slit-like exposure region, and denoted at 61 is the central axis of the exposure region. An arrow depicts the scan direction of the stage. For convenience in of explanation, numbers according to eight rows and thirteen columns are assigned to the measuring picture elements.

In FIG. 4, the measuring picture element array at the fourth column is registered with the exposure slit center 62. Here, if the matrix of corresponding picture element mirrors of the DMD 3 is eight rows and three columns, then picture element mirrors may be reversed (turned on) such as illustrated in FIG. 5A (a practical exposure slit has a size with a width not smaller than 5 mm and a length not smaller than 20 mm, and therefore, the matrix has a size not smaller than 1000×250).

The stage is scanningly moved relative to the exposure slit at about 200 mm/sec. at maximum. If the picture element mirrors have a size of 17 microns, it takes 85 micro-seconds until the picture element mirror at the fifth column reaches the slit center. Since the picture element mirrors of the DMD have a response speed of 10 micro-seconds, it is seen that the picture element mirrors of the DMD have a sufficient response speed with respect to the scan system. Namely, the DMD driver 31 may reverse the picture element mirrors 85 micro-seconds later, such as illustrated in FIG. 5B, by which desired measuring points on the wafer can be measured.

In a practical control system, the stage scan speed may have a fluctuation from 200 mm/sec., and the control of the picture element mirrors of the DMD may be performed by feeding back the stage positional information from a controller 30 of a laser interferometer measuring device, for monitoring the positions of X and Y stages, to the DMD driver 31 through a main control system 100 and then by controlling the picture element mirrors on the basis of the positional information. This is preferable, to the picture element mirror control through open loop time control. Since the picture element mirror control has to be done simultaneously both for the light projecting side DMD element 3 and the light receiving side DMD element 14, the main control 100 may produce the same output signal to both of the DMD drivers 31 and 32.

In the manner as described above, this embodiment can be applied to a single-exposure type stepper and also to a scan exposure type stepper as represented by a step-and-scan stepper, and a high precision focus detecting system can be provided.

Practically, it is not easy to determine small measurement points, but it is necessary to obtain the best result with the present invention. In a process for measuring the height of a wafer surface by use of an optical probe, there may be factors for detection error such as interference caused by a surface that comprises a dielectric film, or the effect of non-uniformness of reflectivity of an underlying layer. However, the former can be reduced by projecting S-polarized light at a large incidence angle. Also, the effect of non-uniformness of reflectivity can be reduced by adjusting the shape of the projected light beam.

On the other hand, the effect of a surface step or warp of a resist cannot easily be reduced even by changing the incidence condition. However, the location of such a resist surface step on the surface to be measured can be detected from design information of a reticle. When a resist is going to be exposed in a certain exposure process, the portion having been patterned by use of the preceding reticle is shaped with a step. In consideration of this, the pattern information about the "preceding reticle" may be inputted into the main control system 100, and the focus measurement position or positions may be automatically discriminated by this main control system 100. Then, during stage scan, an optimum control signal may be applied to the DMD drivers 31 and 32. In this manner, real time best focus control is accomplished.

Figure 6:
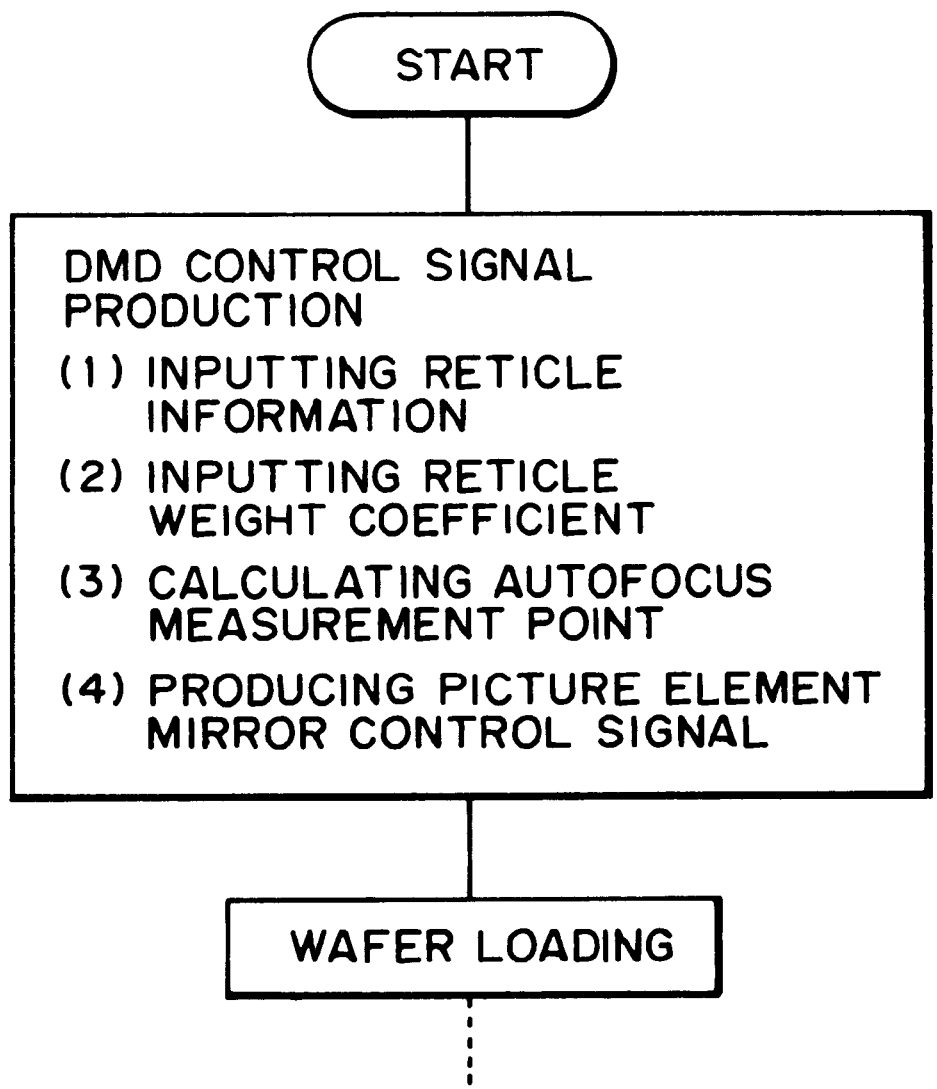
FIG. 6 is a flow chart for explaining an exposure sequence according to the first embodiment of the present invention.

FIG. 6 is a flow chart of a modified sequence for an exposure process, including such a step as described above. A main modification is the inclusion of "DMD control signal production" before wafer loading. For calculation of auto-focus measurement points, reticle information about a preceding single step may be insufficient. This is because a resist surface step may result from all exposure processes up to the preceding process.

However, it is not always necessary to take into account edges attributable to all the processes before the current process. There may be a process such as a gate electrode forming process for MOS transistors, wherein only a small surface step is produced. On the other hand, in a process for device separation or for defining a memory cell region, a large surface step up to 1 micron may be produced.

In consideration of this, among all the preceding reticle information, some layers which are determinant with respect to the surface step may be selected, and a weight coefficient related to the surface step may be inputted. Since, for the reticle information, the reticle design data can be inputted directly, the data may be stored into a magnetic tape, for example, so that it can be read by a stepper control system (Step 1).

The reticle weight coefficient can be determined by the film thickness for wafer oxidization or film formation. Thus, a weight coefficient as determined by film thickness in each process or by intention of a device designer may be inputted from a console of the stepper (Step 2).

Subsequently, autofocus measurement points are determined (Step 3). Since locations of surface steps with respect to the wafer coordinates as well as the magnitudes of them are predetermined, in accordance with Step 1 and Step 2, those of the picture element mirrors of the DMD which are to be actuated to define the measurement points are discriminated.

More specifically, as shown in FIG. 2B-B, for example, the reticle pattern picture is area-divided with respect to the picture element mirror size of the DMD while taking into account the projection magnification, and whether an edge is included in each picture element or not is discriminated. Those regions having no edge or being sufficiently remote from an edge are selected and they are determined as measurement points. A DMD picture element mirror control signal with respect to the wafer position coordinates may be produced from the measurement point information above, and it is stored into the main control system 100.

In an exposure process, the main control system 100 selects a DMD picture element mirror control signal in accordance with position signals of the X and Y stages 8 and 9 as outputted by the controller 30 of the laser interferometer distance measuring device, and it applies the same to the DMD drivers 30 and 31.

Figure 7:
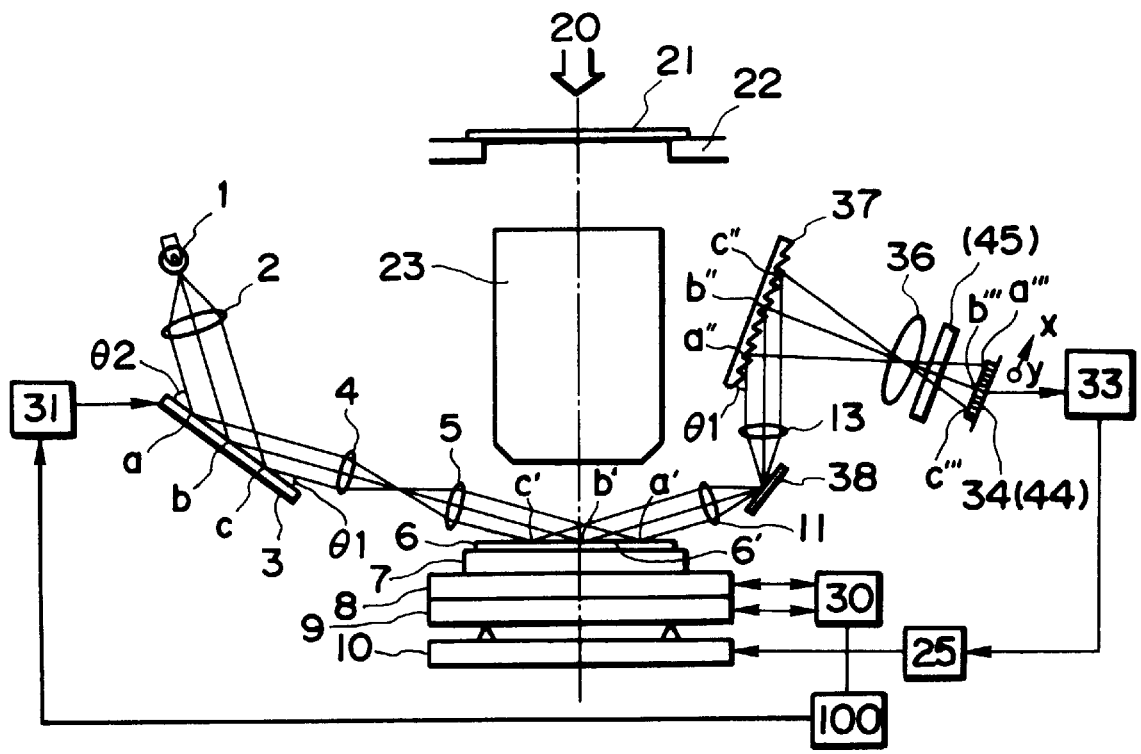
FIG. 7 is a schematic view of a main portion of a projection exposure apparatus according to a second embodiment of the present invention.

FIG. 7 is a schematic view of a main portion of a second embodiment of the present invention. It differs from the first embodiment in that there is no oscillation mirror and no light receiving side DMD used, and that a position sensor is used as the light receiving element. Since no oscillation mirror is used, it is advantageous with respect to real time control. Thus, this embodiment is suitable for a surface position detecting system in a scan type projection exposure apparatus.

Figure 8:
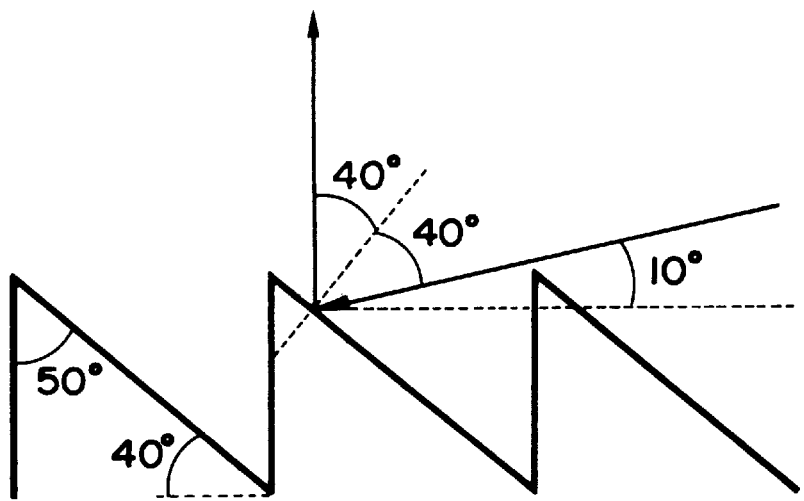
FIG. 8 is a schematic view for explaining a blazed grating used in the embodiment of FIG. 7.

Denoted in FIG. 7 at 37 is a blazed grating which functions as a light scattering element. As shown in FIG. 8, the blazed grating 37 is arranged so that light incident thereon with an angle of about 10 deg. is emitted therefrom perpendicularly with respect to the grating surface. It has a grating pitch of about 1/10 or less of the picture element mirror size. Preferably, metal may deposited on the grating surface to provide a surface reflection factor not less than 90%.

As an alternative, a diffusion plate or a multi-level binary grating may be used. Denoted at 36 is an imaging lens which serves to again re-image, upon a position sensor 34, the slit image having been re-imaged on the blazed grating 37. Denoted at 45 is a cylindrical lens which is used to compress the two-dimensional slit image, imaged on the blazed grating 37, into a one-dimensional image.

When a two-dimensional image is to be handled, the position sensor may comprise an area CCD 34, and when it is compressed into a one-dimensional image, a linear CCD 44 may be used. Although there is only a single imaging lens 36 illustrated, since the slit image of the DMD is relayed by a dual-telecentric lens system, the imaging lens 36 may preferably comprise a dual-telecentric lens. Also, preferably, it may have an imaging magnification of 2 or 3 times or more.

In this embodiment, on the basis of positional information about the pattern as provided by picture element mirrors of the DMD 3 and formed on the position sensor 34 surface, the surface position of the wafer 6 is detected by a signal processing circuit 33. Then, in accordance with the result of the detection, a driver 25 actuates and controls the Z tilt stage 10, like the preceding embodiment.

Figure 9A:
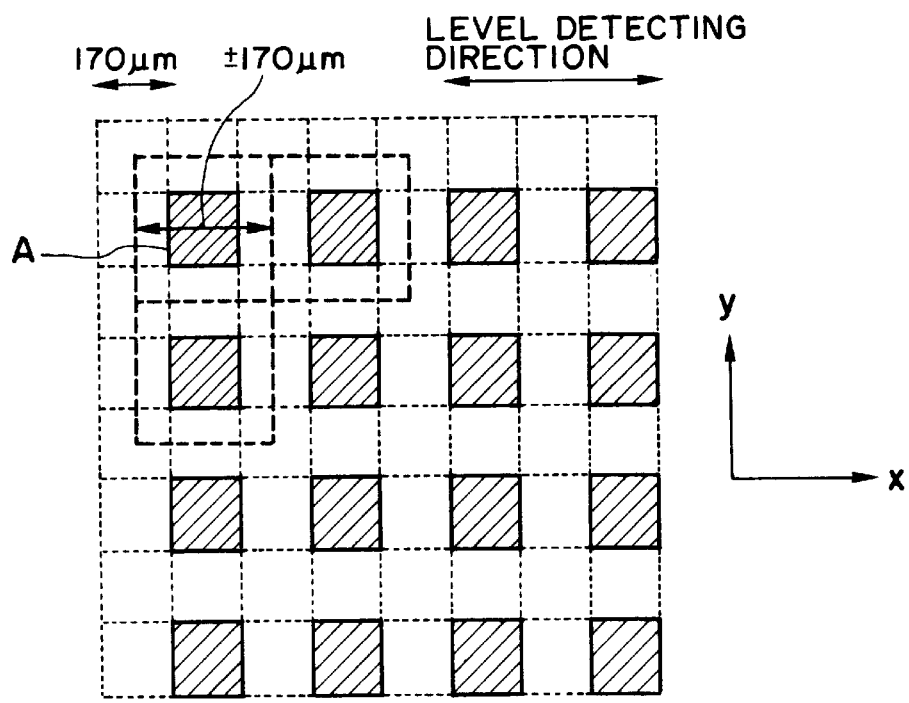
FIGS. 9A and 9B are schematic views, respectively, for explaining a slit image on a position sensor used in the embodiment of FIG. 7.
Figure 9B:
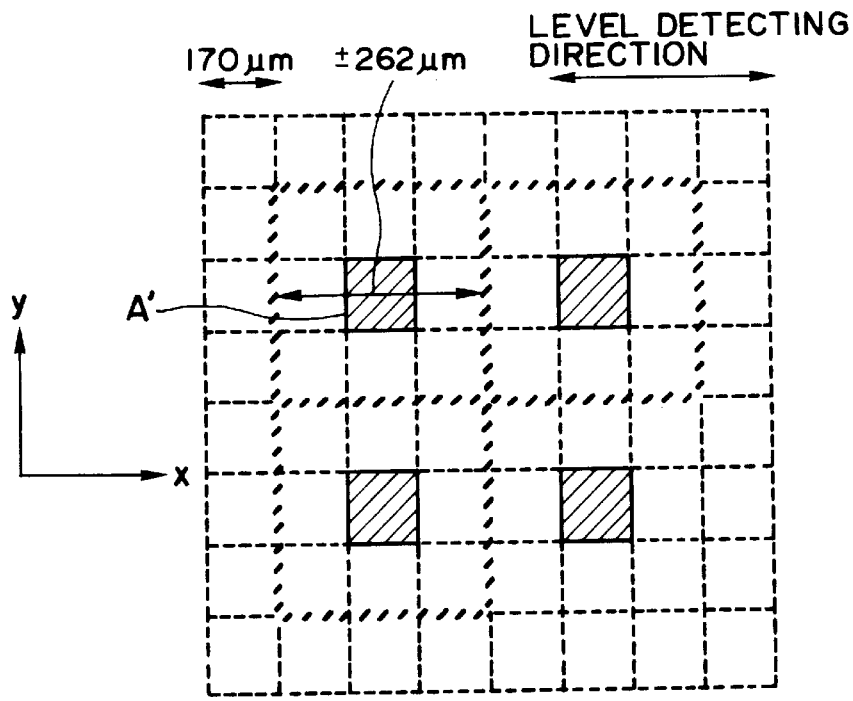

FIGS. 9A and 9B are schematic views, respectively, each showing an example wherein picture element mirrors of the DMD 3 in this embodiment are projected upon an area CCD 34 through an imaging lens 36 having an imaging magnification of 10×.

A background grating of 170 microns square corresponds to picture element mirrors of the DMD, being projected with 10× magnification. In a case wherein measurement picture elements are determined alternately as shown in FIG. 9A, in order that the picture elements at the designated 2n-th column (n=1, 2, . . . ) can be distinguished from the positions of picture elements at the 2(n−1)th column and 2(n+1)th column, a range of ±170 microns upon the sensor should be the detection range. When converted into a height detection range, it is ±15 microns. If the height detection range is to be enlarged, the measurement picture element pitch may be enlarged.

In FIG. 9B, the measurement picture elements are designated in every two elements. In this example, the measurement range increases 1.5 times. If they are designated in every three elements, the range increases twice.

When the cylindrical lens 45 is introduced to convert the two-dimensional slit image into a one-dimensional slit image, the result is what is provided by integrating the two-dimensional image shown in FIGS. 9A or 9B with respect the Y direction. While the detecting positions may be selected at random on the basis of reticle edge information as described hereinbefore, the number of slits can be compressed by integrating them in the Y direction. This is effective to decrease the processing time for slit position detection. In that case, since the slit image shifts only in the X direction in response to a change in height of the object to be examined, there is no necessity of thinning out with respect to the Y direction. Thus, desired picture elements may be used as measurement picture elements.

Figure 10A:
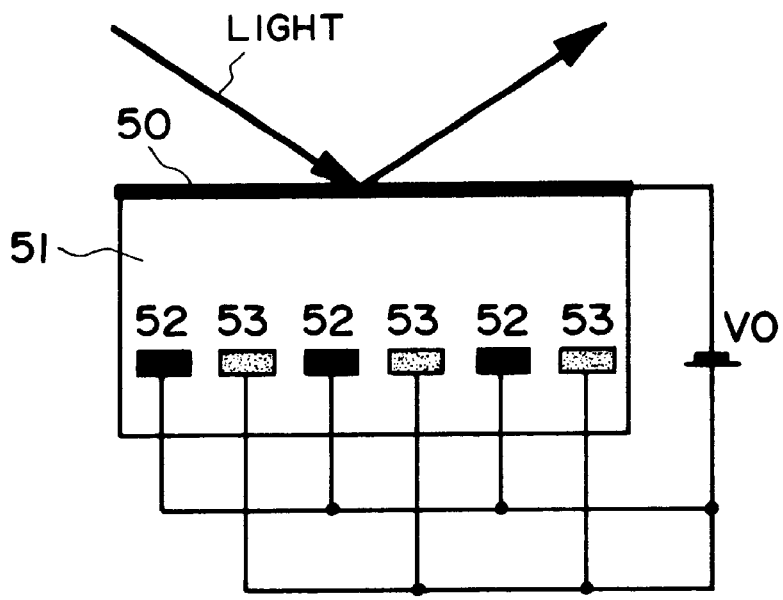
FIGS. 10A and 10B are schematic views, respectively, for explaining an SLM element.
Figure 10B:
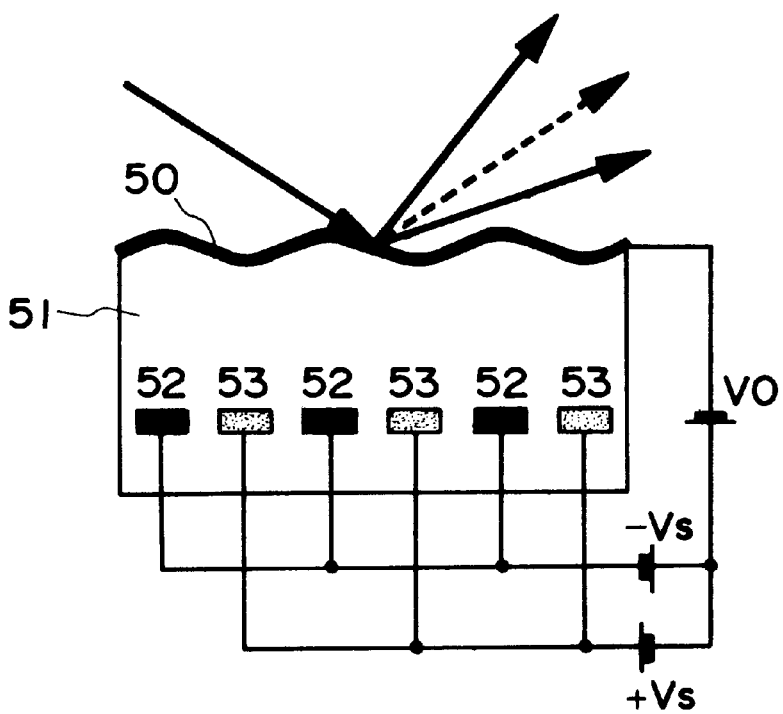

Next, modified examples of a pattern generator will be described. FIGS. 10A and 10B are schematic views for explaining a spatial light modulating element (SLM). It comprises a mirror electrode 50 made of an electrically conductive film and having a predetermined reflection factor with respect to light, as well as picture element electrodes 52 and 53 arrayed two-dimensionally along a plane perpendicular to the sheet of the drawing and sandwiched by a viscoelastic film 51. A base voltage $V_0$ (e.g., 250 V) is applied between the mirror electrode 50 and the picture element electrodes. Between alternately disposed picture element electrodes 52 and 53, there are switches so that a potential difference ±Vs can be applied to them. If Vs=0, a uniform potential distribution is defined within the viscoelastic film 51, such that the mirror electrode 50 is flat and, therefore, it reflects received light regularly (FIG. 10A). If a predetermined voltage (e.g., ±15 V) is applied as the voltage Vs, the potential distribution within the viscoelastic film 51 becomes non-uniform. As a result, the mirror electrode 50 provides a phase grating structure with swells and dents of intervals corresponding to the pitch of the picture element electrodes 52, for example (FIG. 10B). On that occasion, light projected obliquely is scattered or deflected thereby. Thus, this portion may be used as a non-reflective portion of the slit, and then the structure functions as a spatial light modulating element having a unit of a picture element electrode. While the preceding embodiment uses a DMD element as a variable slit, a spatial light modulating element such as described above may be used in place of the DMD element, with substantially the same advantageous results.

Figure 11:
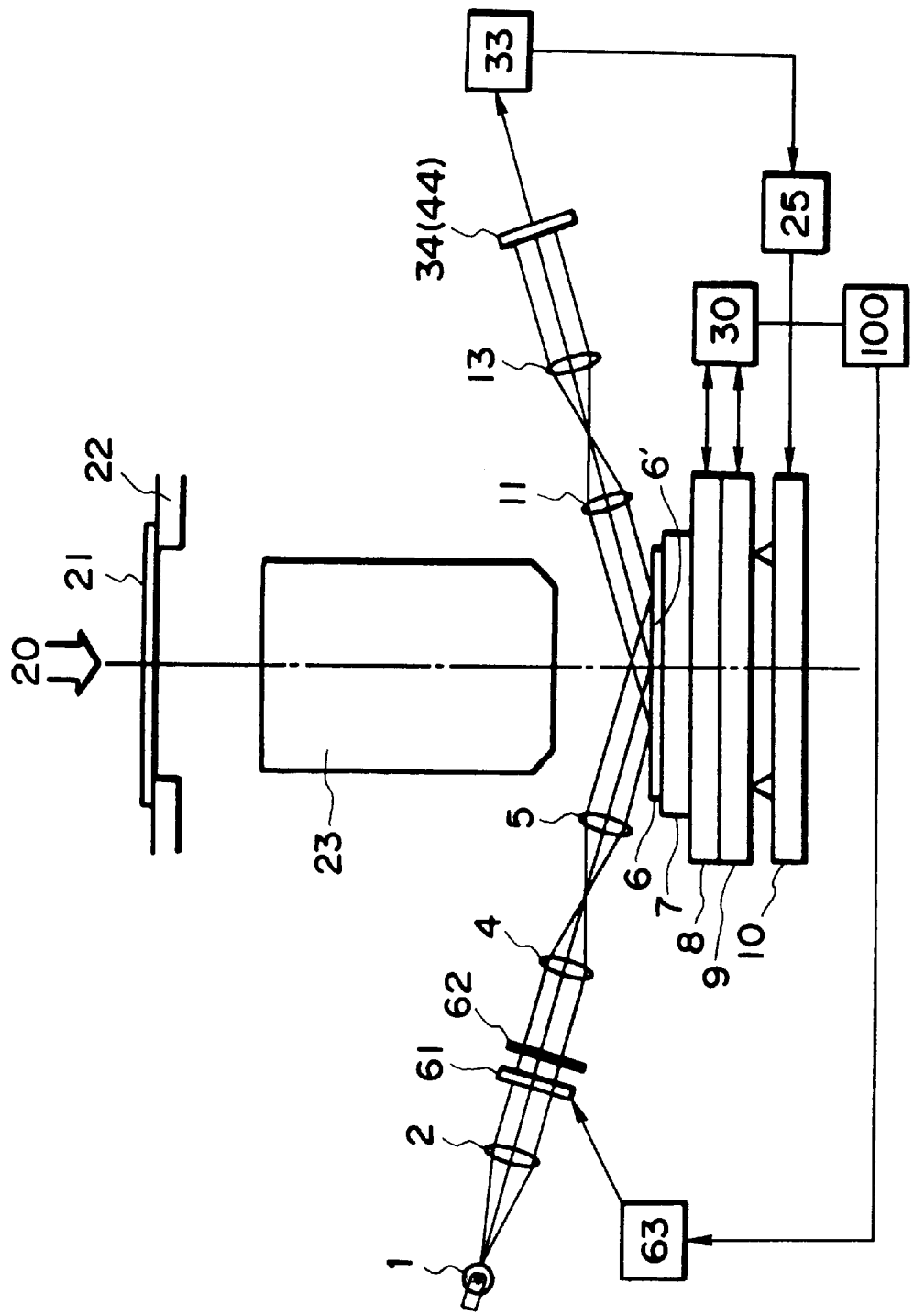
FIG. 11 is a schematic view of a main portion of a projection exposure apparatus according to a third embodiment of the present invention.

When a pattern generator should provide a function as a variable slit only, the spatial light modulating element may be replaced by a liquid crystal device or a two-dimensionally arrayed surface light emitting element, for example. FIG. 11 is a schematic view of a main portion of a third embodiment of the present invention, wherein a liquid crystal device is used to provide a variable slit. Like numerals as those of the preceding embodiments are assigned to corresponding elements, and a description therefor will be omitted. Denoted in the drawing at 61 is a liquid crystal device, and denoted at 62 is a polarization plate. In this embodiment, the position of a stage is monitored by means of a laser distance measuring device 30, and the liquid crystal device 61 is controlled by a liquid crystal controller 63 in association with a main control 100. The light whose polarization is controlled by the liquid crystal device 61 forms, with the polarization plate 62, a two-dimensional slit image as a contrast image.

Figure 12:
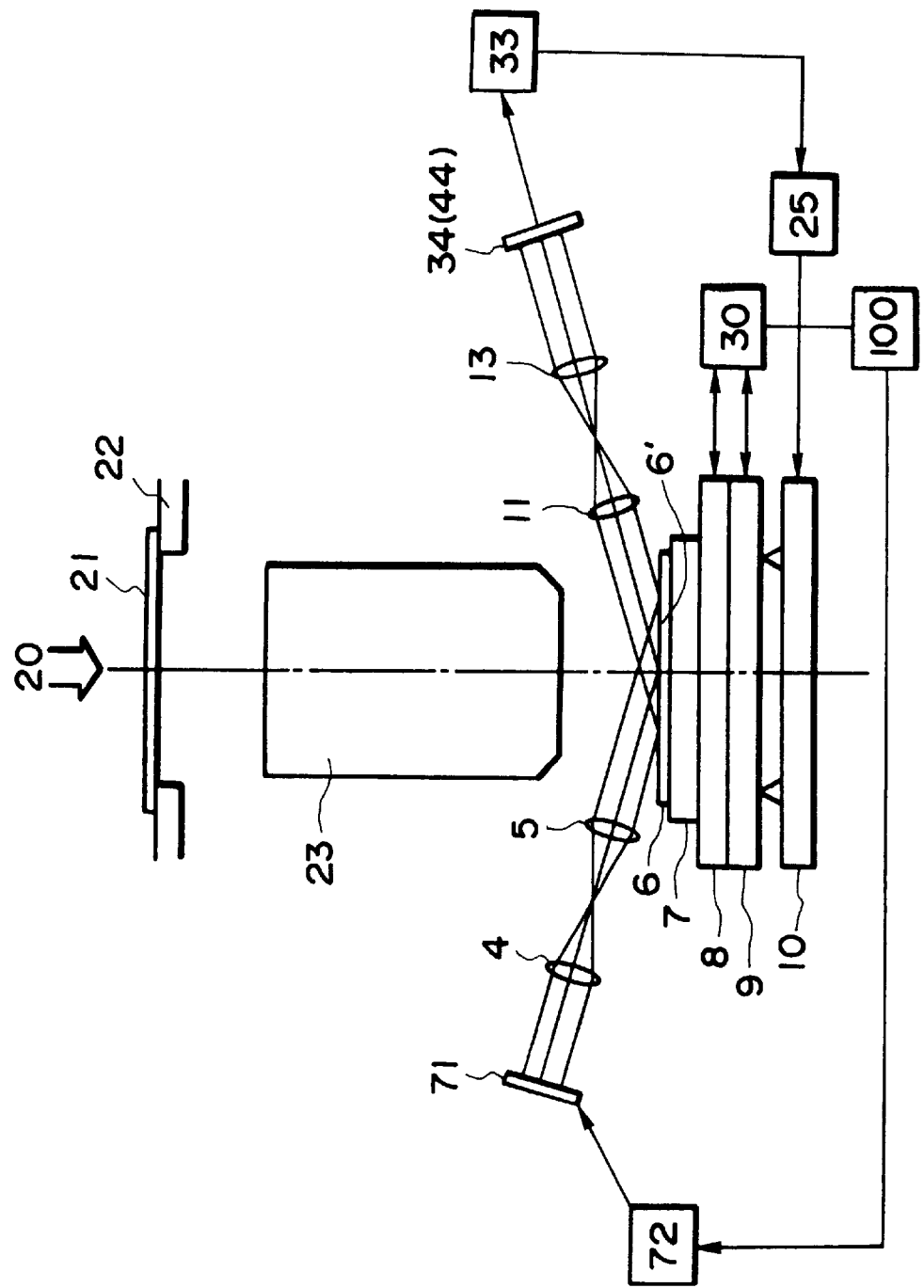
FIG. 12 is a schematic view of a main portion of a projection exposure apparatus according to a fourth embodiment of the present invention.

FIG. 12 is a schematic view of a main portion of a fourth embodiment of the present invention. This is an example wherein two-dimensionally arrayed surface light emitting elements 71 are used as a variable slit. The elements 71 may be replaced by LEDs or LDs being arrayed two-dimensionally. Alternatively, an FED (Field Emission Display) such as a plasma display may be used.

Although the foregoing embodiments have been described with reference to a projection exposure apparatus for semiconductor device manufacture, particularly, to scan exposure apparatuses, the present invention is applicable also to an electron beam exposure apparatus, a liquid crystal exposure apparatus, or an X-ray exposure apparatus, or to a level detecting system used in general.

Next, an embodiment of a device manufacturing method which uses a projection exposure apparatus such as described hereinbefore will be explained.

Figure 13:
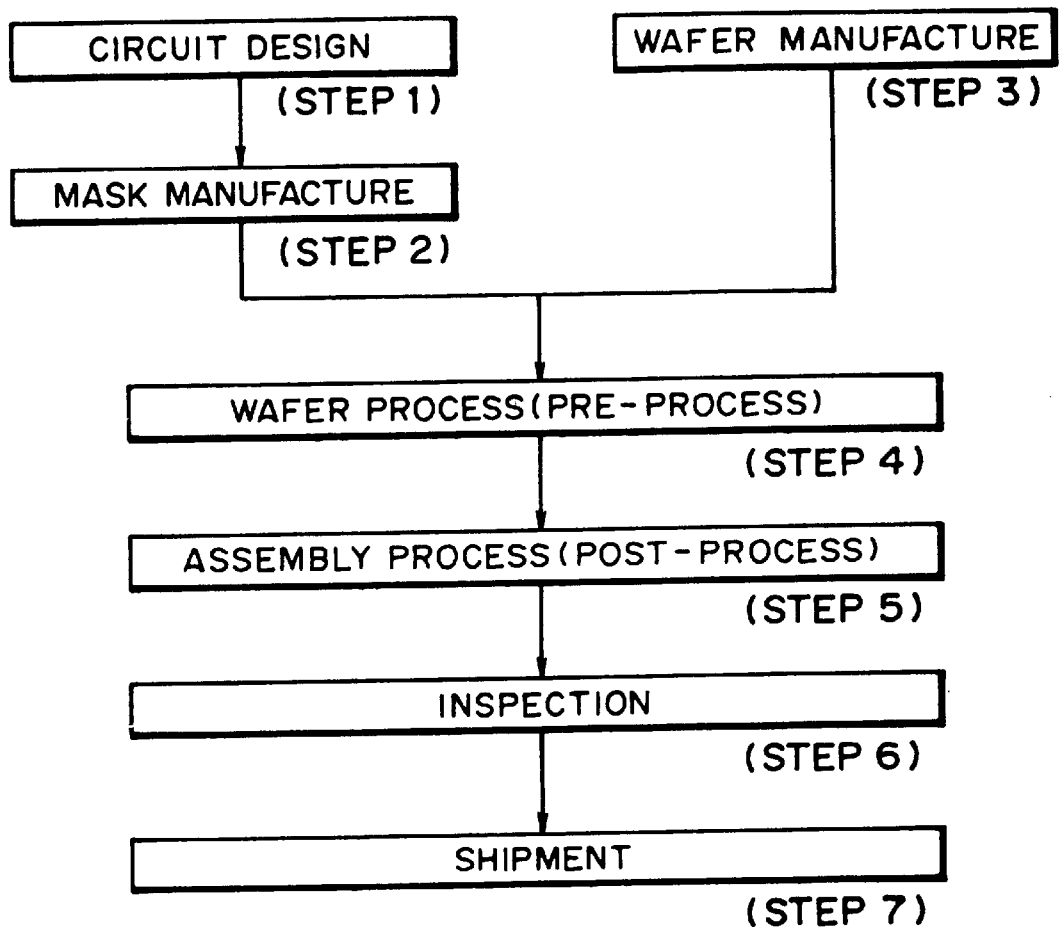
FIG. 13 is a flow chart for explaining a device manufacturing method according to an embodiment of the present invention.

FIG. 13 is a flow chart of a procedure for the manufacture of microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a preprocess wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 14:
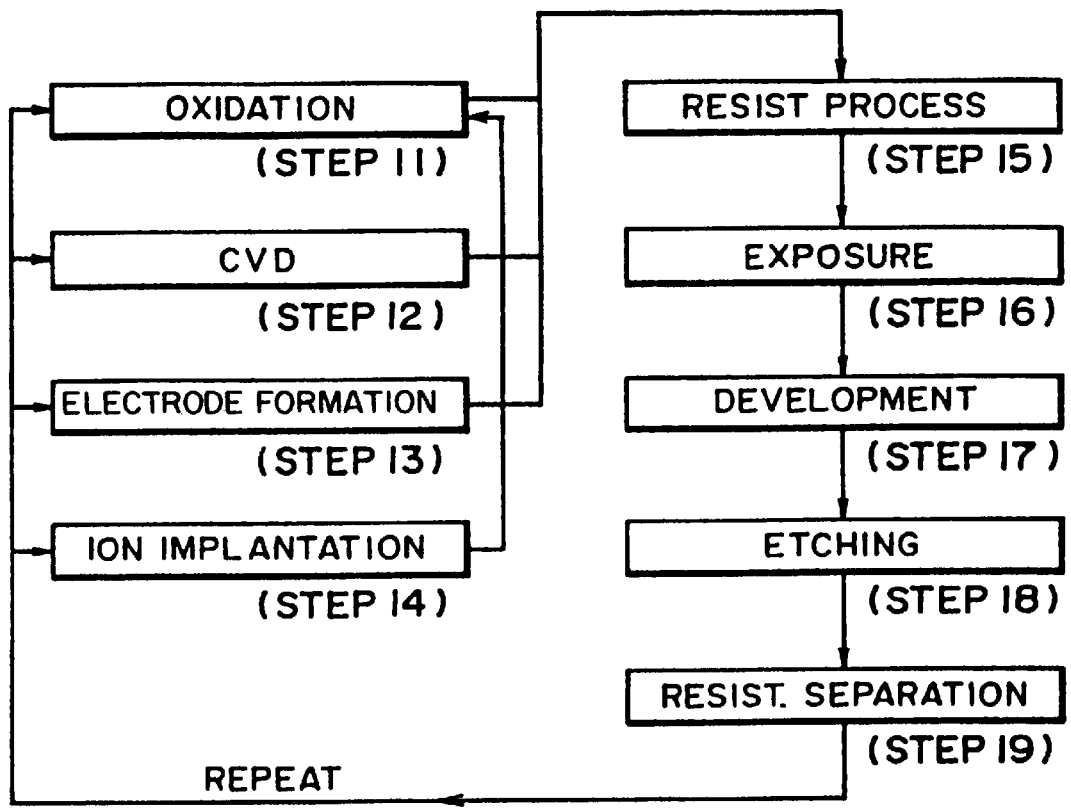
FIG. 14 is a flow chart for explaining a device manufacturing method according to an embodiment of the present invention.

FIG. 14 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured easily.

In accordance with the embodiments of the present invention having been described above, with the arrangement of the components set in the manner as described, positional information about a wafer surface and/or tilt information about the wafer surface can be detected very precisely. Thus, the present invention provides a surface position detecting system and/or a device manufacturing method using the same, by which the wafer surface can be positioned very precisely at the imaging position of a projection optical system and by which large integration devices can be produced easily.

Particularly, when the present invention is applied to a surface position detecting system in a projection exposure apparatus for semiconductor device manufacture, measurement can be made to a desired location within the region to be inspected, and high precision surface position detection with less measurement error is accomplished. Further, even within an exposure shot, selective focus can be made to a narrow-linewidth area. This is very effective to increase the printing precision for a critical layer and to improve the total chip yield.

While the invention has been described with reference to the structures disclosed herein, it is not confined to the details set forth and this application is intended to cover such modifications or changes as may come within the purposes of the improvements or the scope of the following claims.

We claim:

1. A detecting system for detecting positional information related to a surface of an object, said detecting system comprising:

a variable pattern generator for projecting an arbitrary pattern image on the surface of the object;

a light projecting optical system for projecting a pattern, defined by said variable pattern generator, to the surface of the object along an oblique direction;

a light receiving optical system for directing light from an image of the pattern; and a light receiving element for detecting the light directed by said light receiving optical system, wherein surface position information about the surface of the object is detected on the basis of the detection by said light receiving element.

2. A system according to claim 1, further comprising a second pattern generator disposed at a plane where the image of the pattern is re-imaged, wherein said light receiving optical system includes a movable mirror, said light receiving element detects a change, with respect to time, in quantity of light emitted by said second pattern generator during motion of said movable mirror, and the surface position information about the surface of the object is detected on the basis of the detected change in light quantity with respect to time.

3. A system according to claim 2, wherein each of the two pattern generators comprise a DMD.

4. A system according to claim 2, wherein the two pattern generators produce the patterns or analogous patterns.

5. A system according to claim 1, wherein said variable pattern generator comprises a DMD.

6. A system according to claim 1, wherein said variable pattern generator comprises an SLM.

7. A system according to claim 1, wherein said variable pattern generator comprises a liquid crystal device.

8. A system according to claim 1, wherein said variable pattern generator comprises a surface light emitting device.

9. A system according to claim 1, wherein said light receiving element detects positional information about the image of the pattern as re-imaged upon a predetermined plane, and the surface position information about the surface of the object is detected on the basis of that positional information.

10. A system according to claim 1, further comprising conveying means for conveying the object in a direction substantially along the surface of the object, wherein said variable pattern generator changes the pattern to be formed, in accordance with conveyance by said conveying means.

11. An exposure apparatus for projecting a circuit pattern of a reticle onto a photosensitive substrate, said apparatus comprising:
    a projection optical system for performing the pattern projection;
    surface position information detecting means for detecting positional information about the surface of the photosensitive substrate, said surface position information detecting means comprising (i) a variable pattern generator for projecting an arbitrary pattern image on the surface of the substrate, (ii) a light projecting optical system for projecting a pattern, defined by said variable pattern generator, to the surface of the substrate along an oblique direction, (iii) a light receiving optical system for directing light from an image of the pattern, and (iv) a light receiving element for detecting the light directed by said light receiving optical system, wherein surface position information about the surface of the substrate is detected on the basis of the detection by said light receiving element; and
    a control system for controlling a position of the photosensitive substrate with respect to an optical axis of said projection optical system, in accordance with the detection by said surface position information detecting means.

12. An apparatus according to claim 11, further comprising a second pattern generator disposed at a plane where the image of the pattern is re-imaged, wherein said light receiving optical system includes a movable mirror, said light receiving element detects a change, with respect to time, in quantity of light emitted by said second pattern generator during motion of said movable mirror, and the surface position information about the surface of the substrate is detected on the basis of the detected change in light quantity with respect to time.

13. An apparatus according to claim 12, wherein each of the two pattern generators comprise a DMD.

14. An apparatus according to claim 12, wherein the two pattern generators produce the patterns or analogous patterns.

15. An apparatus according to claim 11, wherein said variable pattern generator comprises a DMD.

16. An apparatus according to claim 11, wherein said variable pattern generator comprises an SLM.

17. An apparatus according to claim 11, wherein said variable pattern generator comprises a liquid crystal device.

18. An apparatus according to claim 11, wherein said variable pattern generator comprises a surface light emitting device.

19. An apparatus according to claim 11, wherein said light receiving element detects positional information about the image of the pattern as re-imaged upon a predetermined plane, and the surface position information about the surface of the substrate is detected on the basis of that positional information.

20. An apparatus according to claim 11, further comprising conveying means for conveying the substrate in a direction substantially along the surface of the substrate, wherein said variable pattern generator changes the pattern to be formed, in accordance with conveyance by said conveying means.

21. An electronic device manufacturing method, comprising the steps of:
    projecting a pattern, defined by a variable pattern generator, by projecting an arbitrary pattern image on the surface of a photosensitive substrate, with the variable pattern generator, in a direction inclined with respect to an optical axis of a projection optical system, whereby an image of the pattern is formed on the photosensitive substrate;
    directing light from the image of the pattern to a light receiving element;
    detecting the directed light, with the light receiving element;
    controlling the position of the photosensitive substrate with respect to an optical axis direction of the projection optical system, on the basis of the detection;
    exposing the position controlled photosensitive substrate to a circuit pattern through the projection optical system;
    developing the exposed photosensitive substrate; and
    forming a circuit on the developed substrate, whereby a device is produced.

22. A detecting system for detecting positional information related to a surface of an object, said detecting system comprising:
    a light projecting optical system for projecting light to the surface of the object along an oblique direction, wherein a pattern image is formed on the surface of the object;
    a light receiving optical system for directing light from the pattern image;
    a light receiving element for detecting the light directed by said light receiving optical system, wherein surface position information about the surface of the object is detected on the basis of the detection by said light receiving element;

conveying means for moving the object in a direction approximately along the surface of the object; and a variable pattern generator for projecting an arbitrary pattern image on the surface of the object, wherein said variable pattern generator projects an arbitrary pattern in accordance with the conveyance through said conveying means.

23. A system according to claim 22, further comprising a second pattern generator disposed at a plane where the image of the pattern is re-imaged, wherein said light receiving optical system includes a movable mirror, said light receiving element detects a change, with respect to time, in quantity of light emitted by said second pattern generator during motion of said movable mirror, and the surface position information about the surface of the object is detected on the basis of the detected change in light quantity with respect to time.

24. A system according to claim 23, wherein each of the two pattern generators comprise a DMD.

25. A system according to claim 23, wherein the two pattern generators produce the patterns or analogous patterns.

26. A system according to claim 22, wherein said variable pattern generator comprises a DMD.

27. A system according to claim 22, wherein said variable pattern generator comprises an SLM.

28. A system according to claim 22, wherein said variable pattern generator comprises a liquid crystal device.

29. A system according to claim 22, wherein said variable pattern generator comprises a surface light emitting device.

30. A system according to claim 22, wherein said variable light receiving element detects positional information about the image of the pattern as re-imaged upon a predetermined plane, and the surface position information about the surface of the object is detected on the basis of that positional information.

31. A system according to claim 22, further comprising conveying means for conveying the object in a direction substantially along the surface of the object, wherein said variable pattern generator changes the pattern to be formed, in accordance with conveyance by said conveying means.

32. An exposure apparatus for projecting a circuit pattern of a reticle onto a photosensitive substrate, said apparatus comprising:

a projection optical system for performing the projection exposure;

conveying means for moving the photosensitive substrate in a direction orthogonal to an optical axis of said projection optical system;

surface position information detecting means for detecting positional information about the surface of the photosensitive substrate, said surface position information detecting means comprising (i) a variable pattern generator for projecting an arbitrary pattern image on the photosensitive substrate, said variable pattern generator projecting an arbitrary pattern image in accordance with the conveyance through said conveying means, (ii) a light projecting optical system for projecting light to the surface of the photosensitive substrate in a direction inclined with respect to the optical axis of said projection optical system, wherein the pattern image is formed on the photosensitive substrate surface through the projection, (iii) a light receiving optical system for directing light from the pattern image, and (iv) a light receiving element for detecting the light directed by said light receiving optical system, wherein surface position information about the surface of the object is detected on the basis of the detection by said light receiving element; and a control system for controlling a position of the photosensitive substrate with respect to the optical axis of said projection optical system, in accordance with the detection by said surface position detecting means.

33. An apparatus according to claim 32, further comprising a second pattern generator disposed at a plane where the image of the pattern is re-imaged, wherein said light receiving optical system includes a movable mirror, said light receiving element detects a change, with respect to time, in quantity of light emitted by said second pattern generator during motion of said movable mirror, and the surface position information about the surface of the substrate is detected on the basis of the detected change in light quantity with respect to time.

34. An apparatus according to claim 33, wherein each of the two pattern generators comprise a DMD.

35. A system according to claim 33, wherein the two pattern generators produce the patterns or analogous patterns.

36. An apparatus according to claim 32, wherein said variable pattern generator comprises a DMD.

37. An apparatus according to claim 32, wherein said variable pattern generator comprises an SLM.

38. An apparatus according to claim 32, wherein said variable pattern generator comprises a liquid crystal device.

39. An apparatus according to claim 32, wherein said variable pattern generator comprises a surface light emitting device.

40. An apparatus according to claim 32, wherein said light receiving element detects positional information about the image of the pattern as re-imaged upon a predetermined plane, and the surface position information about the surface of the substrate is detected on the basis of that positional information.

41. An apparatus according to claim 32, further comprising conveying means for conveying the substrate in a direction substantially along the surface of the substrate, wherein said variable pattern generator changes the pattern to be formed, in accordance with conveyance by said conveying means.

42. An electronic device manufacturing method, comprising the steps of:

conveying a photosensitive substrate in a direction perpendicular to an optical axis of a projection optical system;

providing a variable pattern generator for projecting an arbitrary pattern image on the photosensitive substrate, wherein the variable pattern generator projects an arbitrary pattern image in accordance with the conveyance;

projecting light onto the surface of the photosensitive substrate in a direction inclined with respect to the optical axis of the projection optical system, whereby the pattern image is formed on the photosensitive substrate;

directing light from the pattern image to a light receiving element;

detecting the directed light, with the light receiving element;

controlling the position of the photosensitive substrate with respect to an optical axis direction of the projection optical system, on the basis of the detection;

exposing the position controlled photosensitive substrate to a circuit pattern through the projection optical system;

developing the exposed photosensitive substrate; and forming a circuit on the developed substrate, whereby a device is produced.

* * * * *

UNITED STATES PATENT AND TRADEMARK OFFICE
CERTIFICATE OF CORRECTION

PATENT NO. : 6,040,909

DATED : March 21, 2000

INVENTOR(S) : MASANOBU HASEGAWA, ET AL.

It is certified that error appears in the above-identified patent and that said Letters Patent is hereby corrected as shown below:

COLUMN 2:
    Line 22, "group" should read --groups--.

COLUMN 5:
    Line 18, "to" should read --of--; and
    Line 48, "light" (second occurrence) should be deleted.

COLUMN 6:
    Line 29, "angle" should read --angle of--.

COLUMN 7:
    Line 44, "Since" should read --Since,--; and
    Line 58, "in" should be deleted.

COLUMN 9:
    Line 62, "may" should read --may be--.

UNITED STATES PATENT AND TRADEMARK OFFICE
CERTIFICATE OF CORRECTION

PATENT NO. : 6,040,909
DATED : March 21, 2000
INVENTOR(S) : MASANOBU HASEGAWA, ET AL.

It is certified that error appears in the above-identified patent and that said Letters Patent is hereby corrected as shown below:

COLUMN 12:
    Line 42, "to" should read --of--.

COLUMN 16:
    Line 14, "comprise" should read --comprises--.

Signed and Sealed this

Third Day of April, 2001

Attest:

NICHOLAS P. GODICI

Attesting Officer    Acting Director of the United States Patent and Trademark Office